(12) United States Patent
Wang et al.

(10) Patent No.: US 11,362,168 B2
(45) Date of Patent: Jun. 14, 2022

(54) DISPLAY PANEL

(71) Applicant: Au Optronics Corporation, Hsinchu (TW)

(72) Inventors: Jia-Hong Wang, Hsinchu (TW); Min-Tse Lee, Hsinchu (TW); Sheng-Yen Cheng, Hsinchu (TW); Yueh-Hung Chung, Hsinchu (TW); Han-Ming Chen, Hsinchu (TW); Ping-Wen Chen, Hsinchu (TW); Hung-Chia Liao, Hsinchu (TW); Ya-Ling Hsu, Hsinchu (TW); Chen-Hsien Liao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 172 days.

(21) Appl. No.: 16/995,785

(22) Filed: Aug. 17, 2020

(65) Prior Publication Data

US 2021/0057508 A1    Feb. 25, 2021

Related U.S. Application Data

(60) Provisional application No. 62/889,181, filed on Aug. 20, 2019.

(30) Foreign Application Priority Data

Jul. 7, 2020  (TW) ................. 109122938

(51) Int. Cl.
*H01L 27/32* (2006.01)
*G02F 1/1362* (2006.01)

(52) U.S. Cl.
CPC ........ *H01L 27/3276* (2013.01); *G02F 1/1362* (2013.01); *H01L 27/3218* (2013.01)

(58) Field of Classification Search
CPC ............. H01L 27/3276; H01L 27/3218; H01L 27/3211; G02F 1/1362; G02F 1/136286
See application file for complete search history.

(56) References Cited

U.S. PATENT DOCUMENTS

8,723,194 B2    5/2014 Chiang et al.
2018/0151111 A1*  5/2018 Woo ..................... G09G 3/3233

\* cited by examiner

*Primary Examiner* — Donald L Raleigh
(74) *Attorney, Agent, or Firm* — JCIPRNET (57) ABSTRACT

A display panel including sub pixels, a plurality of first and second scan lines, a plurality of first and second data lines, a plurality of first and second auxiliary lines and first conductive vias is provided. The sub pixels are arranged into first rows arranged in a first direction and second rows arranged in a second direction. The second rows are electrically connected to the first and second scan lines in alternation and are electrically connected to the first and second data lines in alternation. Each first auxiliary line includes a first portion electrically connected to a corresponding first scan line and a second portion spaced away from the first portion. The second auxiliary lines are respectively located between two adjacent first rows. Each second scan line is electrically connected to a corresponding first scan line through at least one second auxiliary line.

20 Claims, 4 Drawing Sheets

DISPLAY PANEL

CROSS-REFERENCE TO RELATED APPLICATION

This application claims the priority benefits of U.S. provisional application Ser. No. 62/889,181, filed on Aug. 20, 2019, and Taiwan application serial no. 109122938, filed on Jul. 7, 2020. The entirety of each of the above-mentioned patent applications is hereby incorporated by reference herein and made a part of this specification.

BACKGROUND

Technical Field

The invention relates to an electronic device, and particularly relates to a display panel.

Description of Related Art

In order to meet requirements on various shapes of electronic devices, a display panel needs to use vertical auxiliary lines to connect horizontal scan lines to input scan signals and data signals from a same side of the display panel. However, under such design framework, pixel voltages of a part of sub-pixels may be affected by a coupling effect of the horizontal scan lines and the vertical auxiliary lines, resulting in gray scale variation of the part of the sub-pixels and poor image performance.

SUMMARY

The invention is directed to a display panel, which mitigates influence of a coupling effect.

An embodiment of the invention provides a display panel including a plurality of sub-pixels, a plurality of first scan lines, a plurality of second scan lines, a plurality of first data lines, a plurality of second data lines, a plurality of first auxiliary lines, a plurality of first conductive vias, and a plurality of second auxiliary lines. The sub-pixels are arranged into a plurality of first rows arranged in a first direction and a plurality of second rows arranged in a second direction intersected with the first direction. The first scan lines and the second scan lines are arranged in alternation in the second direction and are respectively electrically connected to the second rows. The first data lines and the second data lines are arranged in alternation in the first direction. There are one first data line and one second data line between any two adjacent first rows. The second rows are electrically connected to the first data lines and the second data lines in alternation. Each of the first auxiliary lines extends in the second direction and includes a first portion and a second portion arranged in the second direction. The first portion is electrically connected to one corresponding first scan line through at least one first conductive via. The second portion is spaced apart from the first portion and electrically insulated from the first portion. The second auxiliary lines are respectively located between two adjacent first rows. Each of the second auxiliary lines extends from one corresponding first scan line to an adjacent second scan line in the second direction, and each of the second scan lines is electrically connected to one corresponding first scan line through at least one second auxiliary line.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Directional terminology mentioned in this specification, such as "top," "bottom," "front," "back," "left," "right," etc., is used with reference to the orientation of the Figure(s) being described and are not intended to be limiting of the invention.

In the figures, each of the drawings depicts typical features of methods, structures, and/or materials used in the particular exemplary embodiments. However, these drawings are not to be interpreted as limiting or limiting the scope or property covered by these exemplary embodiments. For example, for clarity, relative size, thickness and position of each film layer, region and/or structure may be reduced or enlarged.

In the following different embodiments, the same or similar components are denoted by the same or similar referential numbers, and descriptions of the same technical contents are omitted. Moreover, the features in the different exemplary embodiments may be combined with each other in case of no confliction, and the simple equivalent changes and modifications made in accordance with the scope of the specification or the claims are still within the scope of the patent.

Furthermore, "first", "second", etc. mentioned in the specification and the claims are merely used to name discrete components or distinguish different embodiments or ranges, and should not be regarded as limiting the upper or lower bound of the number of the components, nor is it used to define a manufacturing order or setting order of the components. Moreover, one element/film layer disposed on (or above) another element/film layer may cover a situation that the element/film layer is directly disposed on (or above) the other element/film layer, and the two elements/film layers directly contact with each other, and a situation that the element/film layer is indirectly disposed on (or above) the other element/film layer, and one or more elements/film layers exist between the two elements/film layers.

FIG. 1 to FIG. 4 are partial top views of a display panel according to a plurality of embodiments of the invention. For simplicity's sake, FIG. 1 to FIG. 4 only schematically illustrate a partial structure of an active device array substrate in the display panel. However, it should be understood that the active device array substrate of the display panel may further include other devices or film layers in addition to the illustrated structure. Moreover, in addition to the active device array substrate, the display panel may further include an opposite substrate and a display medium layer between the active device array substrate and the opposite substrate. The display medium layer may include a liquid crystal layer or an organic light-emitting layer, but the invention is not limited thereto. Existing designs may be referred for the opposite substrate and the display medium layer in the display panel, and descriptions thereof are omitted.

Figure 1:
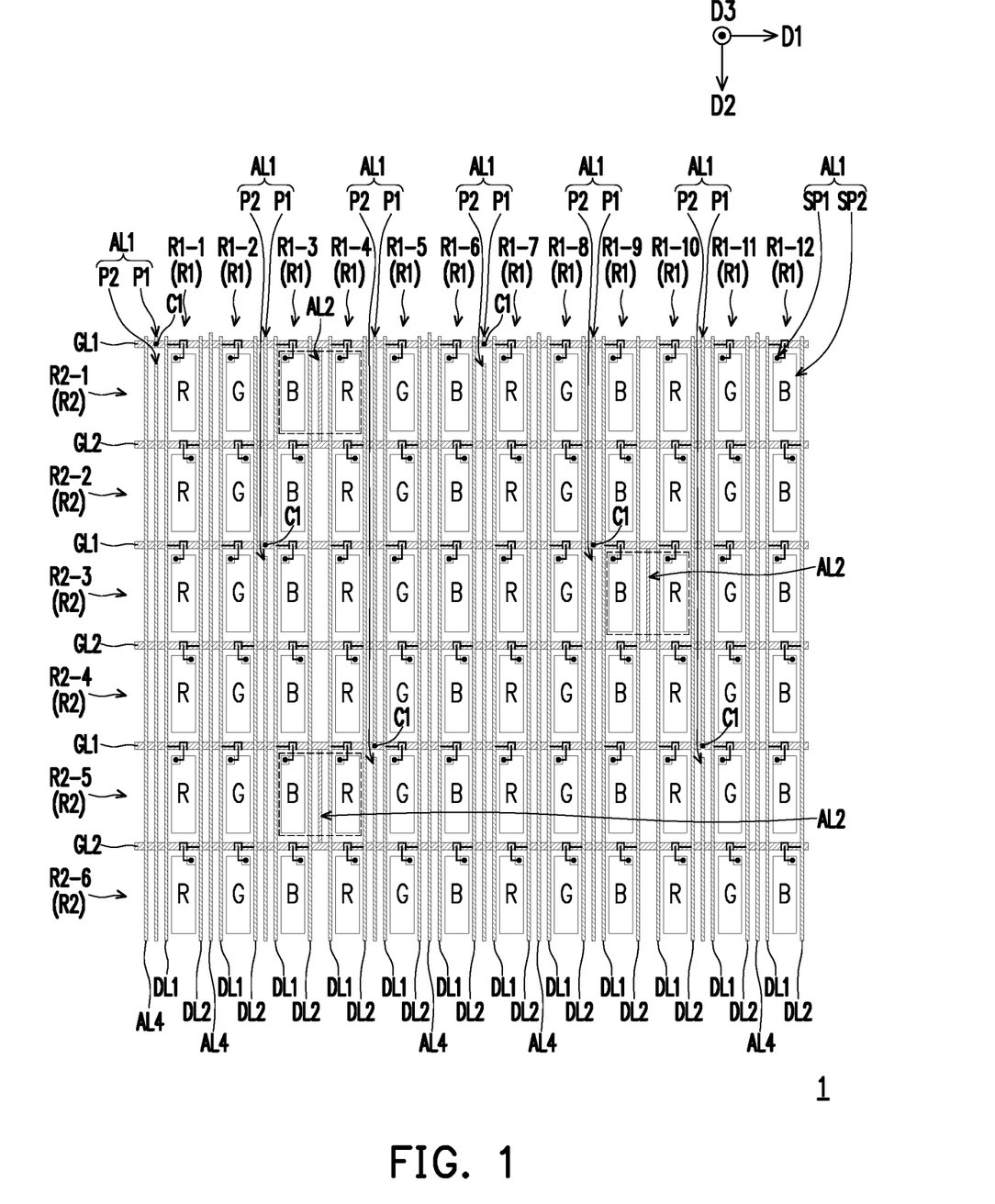
FIG. 1 to FIG. 4 are partial top views of a display panel according to a plurality of embodiments of the invention.

Referring to FIG. 1, the display panel 1 may include a plurality of sub-pixels SP, a plurality of first scan lines GL1, a plurality of second scan lines GL2, a plurality of first data lines DL1, a plurality of second data lines DL2, a plurality of first auxiliary lines AL1, a plurality of first conductive vias C1, and a plurality of second auxiliary lines AL2.

The sub-pixels SP are arranged in an array. The array may include a plurality of first rows R1 arranged in a first direction D1 and a plurality of second rows R2 arranged in a second direction D2. The second direction D2 is intersected with the first direction D1. As shown in FIG. 1, the second direction D2 may be perpendicular to the first direction D1, but the invention is not limited thereto. The sub-pixels SP may be arranged into twelve first rows R1 (such as a first row R1-1 to a first row R1-12) and six second rows R2 (such as a second row R2-1 to a second row R2-6), where each of the first rows R1 includes six sub-pixels SP arranged at intervals, and each of the second rows R2 includes twelve sub-pixel SPs arranged at intervals. However, the respective number of the sub-pixels SP, the first rows R1, the second rows R2, the sub-pixels SP in the first row R1, or the sub-pixels SP in the second row R2, etc., or the arrangement of the sub-pixels SP may be changed according to an actual requirements (such as a shape or a resolution, etc., of the display panel).

The sub-pixels SP may include a plurality of red sub-pixels R, a plurality of green sub-pixels G, and a plurality of blue sub-pixels B. The sub-pixels SP in each first row R1 may have a same color, and the sub-pixels SP in each second row R2 may include plural of the red sub-pixels R, plural of the green sub-pixels G and plural of the blue sub-pixels B arranged in alternation in the first direction D1. However, the color types and arrangement of the sub-pixels SP may be changed according to an actual requirement.

Each of the sub-pixels SP may include one or a plurality of active devices SP1 and one or a plurality of pixel electrodes SP2. The active device SP1 may include a gate electrode (not shown), a gate insulating layer (not shown), a semiconductor layer (not shown), an insulating layer (not shown), a source electrode (not shown), and a drain electrode (not shown) electrically connected to the pixel electrode SP2. Existing designs may be referred for the relative arrangement relationship of multiple elements in the active device SP1, which is not repeated.

The first scan lines GL1 and the second scan lines GL2 are arranged in alternation in the second direction D2. As shown in FIG. 1, odd-numbered rows (for example, the second row R2-1, the second row R2-3, or the second row R2-5) in the second rows R2 may be located between the first scan line GL1 and the second scan line GL2 sequentially arranged in the second direction D2, and the even-numbered rows (for example, the second row R2-2 or the second row R2-4) in the second rows R2 may be located between the second scan line GL2 and the first scan line GL1 sequentially arranged in the second direction D2.

The first scan lines GL1 and the second scan lines GL2 are electrically connected to the second rows R2, respectively. As shown in FIG. 1, the odd-numbered rows (for example, the second row R2-1, the second row R2-3, and the second row R2-5) in the second rows R2 may be electrically connected to the first scan lines GL1, respectively, and the even-numbered rows (such as the second row R2-2, the second row R2-4, and the second row R2-6) in the second rows R2 may be electrically connected to the second scan lines GL2, respectively, and each of the second rows R2 is electrically connected to one first scan line GL1 or one second scan line GL2. In the specification, the electrical connection between the second row R2 and the scan line (such as the first scan line GL1 or the second scan line GL2) refers to that a plurality of the gate electrodes in the sub-pixels SP (including plural of the red sub-pixels R, plural of the green sub-pixels G, and plural of the blue sub-pixels B) arranged into the second row R2 are electrically connected to the scan line.

The first data lines DL1 and the second data lines DL2 are arranged in alternation in the first direction D1. As shown in FIG. 1, each of the first rows R1 may be located between the first data line DL1 and the second data line DL2 sequentially arranged in the first direction D1, and there are one first data line DL1 and one second data line DL2 between any two adjacent first rows R1.

The second rows R2 are electrically connected to the first data lines DL1 and the second data lines DL2 in alternation. As shown in FIG. 1, the odd-numbered rows (for example, the second row R2-1, the second row R2-3, and the second row R2-5) in the second rows R2 may be electrically connected to the first data lines DL1, and the even-numbered rows (for example, the second row R2-2, the second row R2-4, and the second row R2-6) in the second rows R2 may be electrically connected to the second data lines DL2. Moreover, in each of the first rows R1, the sub-pixels SP located in the odd-numbered rows (for example, the $1^{st}$, $3^{rd}$, and $5^{th}$ sub-pixels SP sequentially counted from top to bottom in each first row R1) are electrically connected to one first data line DL1, and the sub-pixels SP located in the even-numbered rows (for example, the $2^{nd}$, $4^{th}$ and $6^{th}$ sub-pixels SP sequentially counted from top to bottom in each first row R1) are electrically connected to one second data line DL2, and the sub-pixels SP of the odd-numbered rows and the sub-pixels SP of the even-numbered rows are located between the one first data line DL1 and the one second data line DL2. In the specification, the electrical connection between the second row R2 and the data lines (such as the first data lines GL1 or the second data lines GL2) refers to that a plurality of the source electrodes in the sub-pixels SP (including plural of the red sub-pixels R, plural of the green sub-pixels G, and plural of the blue sub-pixels B) arranged into the second row R2 are electrically connected to the data lines.

The first auxiliary lines AL1 are disposed in parallel with the first data lines DL1 and the second data lines DL2, where there may be two or more first rows R1 between two adjacent first auxiliary lines AL1. Each of the first auxiliary lines AL1 extends in the second direction D2, and each of the first auxiliary lines AL1 includes a first portion P1 and a second portion P2 arranged in the second direction D2. The first portion P1 is, for example, connected to a gate signal end (not shown) and extends from the gate signal end to a corresponding first scan line GL1 along the second direction D2, and is electrically connected to the corresponding first scan line GL1 through at least one first conductive via C1. The second portion P2 is spaced apart from the first portion P1 and is electrically insulated from the first portion P1. For example, an end of the first portion P1 close to the second portion P2 may terminate above the corresponding first scan line GL1, and the second portion P2 may extend away from the first portion P1 in the second direction D2 from a position close to the end of the first portion P1. In some embodiments, the second portion P2 is, for example, connected to a direct current (DC) signal end to provide a voltage stabilizing effect, but the invention is not limited thereto.

The first auxiliary lines AL1, the first data lines DL1, and the second data lines DL2 may belong to a same conductive layer, i.e., the first auxiliary lines AL1 may be formed together with the first data lines DL1 and the second data lines DL2. The conductive layer may be a metal layer. The metal layer may be a single-layer metal layer or a stacked layer of multi-layer metal layers.

FIG. 1 schematically illustrates six first auxiliary lines AL1, where each of the first scan lines GL1 is electrically connected to plural (for example, two) of the first auxiliary lines AL1. In other embodiments, each of the first scan lines GL1 may be electrically connected to one, or two or more first auxiliary lines AL1. By increasing the number of the first auxiliary lines AL1 electrically connected to each of the first scan lines GL1, it helps reducing impedance and improving uniformity of a display image. However, the total number of the first auxiliary lines AL1 or the number of the first auxiliary lines AL1 electrically connected to each of the first scan lines GL1 may be changed according to an actual requirement.

The second auxiliary lines AL2 are respectively located between two adjacent first rows R1. Further, the second auxiliary lines AL2 are located in the array formed by the sub-pixels SP, where the second auxiliary lines AL2 may all be arranged between only two adjacent first rows R1 (the two adjacent first rows R1 are referred to as a group of first rows R1) in the second direction D2, or the second auxiliary lines AL2 may be respectively located between a plurality of groups of the first rows R1. For example, the second auxiliary lines AL2 may be arranged in a staggered manner (as shown in FIG. 1). The staggered arrangement refers to that the second auxiliary lines AL2 may be distributed in the array formed by the sub-pixels SP in an irregular manner, instead of being regularly distributed in the array formed by the sub-pixels SP. Through the design of staggered arrangement, a Moire pattern phenomenon caused by periodic structure may be avoided, and human eye's perception of gray scale variation may be reduced.

Each of the second auxiliary lines AL2 extends from a corresponding first scan line GL1 to an adjacent second scan line GL2 in the second direction D2, and each of the second scan lines GL2 is electrically connected to a corresponding first scanning line GL1 through at least one second auxiliary line AL2. For example, the second auxiliary lines AL2, the first scan lines GL1, and the second scan lines GL2 may belong to a same conductive layer, and each of the second auxiliary lines AL2 is in contact with one electrically connected first scan line GL1 and one electrically connected second scan line GL2. Alternatively, the second auxiliary lines AL2 may not belong to the same conductive layer as the first scan lines GL1 and the second scan lines GL2, and the display panel 1 may further include a plurality of second conductive vias (not shown), where each of the second auxiliary lines AL2 is electrically connected to one corresponding first scan line GL1 and one corresponding second scan line through plural of the second conductive vias. In some embodiments, the first scan lines GL1 and the second scan lines GL2 belong to a first conductive layer, and the second auxiliary lines AL2 may belong to a second conductive layer together with the first data lines DL1 and the second data lines DL2. Alternatively, the second auxiliary lines AL2 may not be in the same layer with any of the scan lines and the data lines.

FIG. 1 schematically illustrates three second auxiliary lines AL2, where each of the second scan lines GL2 is electrically connected to the corresponding first scan line GL1 through a second auxiliary line AL2. In other embodiments, each of the second scan lines GL2 may be electrically connected to the corresponding first scan line through plural of the second auxiliary lines AL2. By increasing the number of the second auxiliary lines AL1 electrically connecting each of the first scan lines GL1 with the corresponding second scan line GL2, it helps reducing impedance and improving uniformity of a display image. However, the total number of the second auxiliary lines AL1 or the number of the second auxiliary lines AL1 electrically connecting each of the first scan lines GL1 with the corresponding second scan line GL2 may be changed according to an actual requirement.

By using the second auxiliary line AL2 to electrically connect each of the first scan lines GL1 and the corresponding second scan line GL2, the two adjacent second rows R2 may receive the scan signal at a same timing, and in collaboration with signal input of the first data line DL1 and the second data line DL2, a driving mode of two data lines and half gate line (2DHG) may be realized. In detail, the scan signal is, for example, input to the first scan lines GL1 through the first portions P1 of the first auxiliary lines AL1 at different timings. In each timing, the scan signal transmitted to the first scan line GL1 is transmitted to the corresponding second scan line GL2 through the second auxiliary line AL2, so that the active devices SP1 of the sub-pixels SP in two adjacent second rows R2 are turned on in the same timing. When the active devices SP1 are turned on, the data signals are sequentially output to the first data lines DL1 and the second data lines DL2 that are arranged in alternation in the first direction D1.

As shown in FIG. 1, each of the first scan lines GL1 is electrically connected to one second scan line GL2 and two adjacent second rows R2. The electrically connected one first scan line GL1 and one second scan line GL2 are respectively located on opposite sides of one of the two adjacent second rows R2, and the second scan line GL2 is located between the two adjacent second rows R2. Since the first scan line GL1 is located on one side (such as the side of the gate signal end) of the electrically connected two adjacent second rows R2, rather than between the electrically connected two adjacent second rows R2, the number of the sub-pixels SP affected by a coupling effect of the first scan line GL1 (or the second scan line GL2) and the first portion P1 of the first auxiliary line AL1 (or the second auxiliary line AL2) in the two adjacent second rows R2 may be reduced. Since the two sub-pixels SP located at two sides of the second auxiliary line AL2 in the first direction D1 (referring to a frame encircled by dotted line) may be affected by the coupling effect, each second auxiliary line AL2 may be disposed between the adjacent red sub-pixel R and blue sub-pixel B to avoid the coupling effect from affecting the green sub-pixel where human eyes are more likely to perceive the gray scale variation.

In the embodiment, each of the first scan lines GL1 and one electrically connected second scan line GL2 are electrically connected to the first portion P1 of at least one (for example, two) first auxiliary line AL1, and the first portion P1 of the at least one first auxiliary line AL1 is not overlapped with the electrically connected second scan line GL2 in a third direction D3 perpendicular to the first direction D1 and the second direction D2. To be specific, the second scan line GL2 may be electrically connected to the corresponding first scan line GL1 through the second auxiliary line AL2, so that the first portion P1 of the first auxiliary line AL1 electrically connected to the first scan line GL1 is unnecessary to be electrically connected to the second scan line GL2 through the conductive via, and the first portion P1 of the first auxiliary line AL1 electrically connected to the first scan line GL1 is unnecessary to be extended to the top of the electrically connected second scan line GL2, thereby minimizing the number of the sub-pixels SP affected by the coupling effect of the first portion P1 and the first scan line GL1 (or the second scan line GL2). Moreover, compared with the situation that the second scan line GL2 also receives the scan signal in synchronization with the first scan line GL1 through the first portion P1 and the conductive via, by using the second auxiliary line AL2 to achieve synchronous reception of the scan signal between the first scan line GL1 and the second scan line GL2, besides that an influence range of the coupling effect is reduced, the image performance is also improved through a position design of the second auxiliary line AL2 (for example, disposed between the red sub-pixel R and the blue sub-pixel B).

A distance between each second auxiliary line AL2 and one electrically connected first auxiliary line AL1 may be determined according to an actual design requirement (such as a size, a resolution, a line impedance, etc., of the display panel 1). In some embodiments, there may be one or plural of the first rows R1 between each second auxiliary line AL2 and one electrically connected first auxiliary line AL1. In some other embodiments, each of the second auxiliary lines AL2 may be arranged beside the electrically connected first auxiliary line AL1, and the second auxiliary line AL2 and the electrically connected first auxiliary line AL1 may be located between two adjacent first rows R1.

According to different requirements, the display panel 1 may further include other devices or film layers. For example, the display panel 1 may further include a plurality of fourth auxiliary lines AL4. The fourth auxiliary lines AL4 are respectively located between two adjacent first rows R1, i.e., the fourth auxiliary lines AL4 may be located in the array formed by the sub-pixels SP, but the invention is not limited thereto. In some embodiments, the fourth auxiliary lines AL4 are, for example, connected to the DC signal end to provide a voltage stabilizing effect, but the invention is not limited thereto. In some other embodiments, the fourth auxiliary lines AL4 may also be used as repair lines.

The fourth auxiliary lines AL4, the first data lines DL1, and the second data lines DL2 may belong to a same conductive layer, i.e., the fourth auxiliary lines AL4 may be formed together with the first data lines DL1 and the second data lines DL2. The conductive layer may be a metal layer. The metal layer may be a single-layer metal layer or a stacked layer of multi-layer metal layers.

Figure 2:
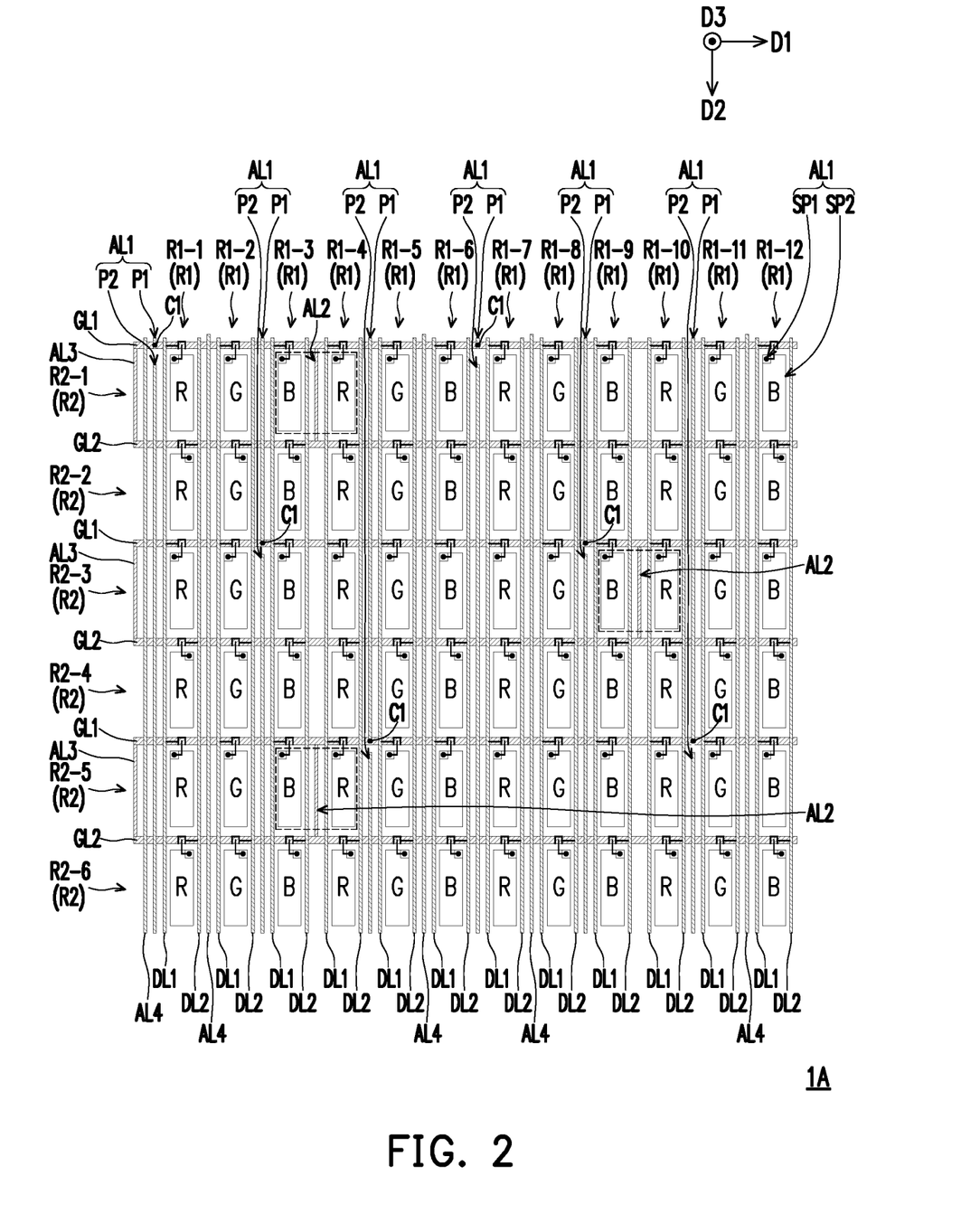

Referring to FIG. 2, a main difference between a display panel 1A and the display panel 1 of FIG. 1 is that the display panel 1A further includes a plurality of third auxiliary lines AL3. The third auxiliary lines AL3 are disposed near the ends of the first scanning lines GL1 and the second scanning lines GL2. Each of the third auxiliary lines AL3 extends from one corresponding first scan line GL1 to the adjacent second scan line GL2 in the second direction D2, and each of the second scan lines GL2 is further electrically connected to the corresponding first scan line GL1 through at least one third auxiliary line AL3. FIG. 2 illustrates that each of the second scan lines GL2 is further electrically connected to the corresponding first scan line GL1 through a third auxiliary line AL3. In other embodiments, each of the second scan lines GL2 may be electrically connected to the corresponding first scan line GL1 through plural (for example, two or more) of the third auxiliary lines AL3. The third auxiliary lines AL3 may be respectively located at two opposite ends of the first scan line GL1 (and the second scan line GL2), but the invention is not limited thereto. The disposition of the third auxiliary line AL3 helps to reduce the impedance and improve the uniformity of the display image.

The third auxiliary lines AL3, the first scan lines GL1, and the second scan lines GL2 may belong to a same conductive layer, and each of the third auxiliary lines AL3 is in contact with one electrically connected first scan line GL1 and one electrically connected second scan line GL2. Alternatively, the third auxiliary lines AL3 may not belong to the same conductive layer as the first scan lines GL1 and the second scan lines GL2, and the display panel 1A may further include a plurality of third conductive vias (not shown), where each of the third auxiliary lines AL3 is electrically connected to a corresponding first scan line GL1 and a corresponding second scan line GL2 through plural of the third conductive vias. In some embodiments, the first scan lines GL1 and the second scan lines GL2 belong to the first conductive layer, and the third auxiliary lines AL3 may belong to the second conductive layer together with the first data lines DL1 and the second data lines DL2. Alternatively, the third auxiliary lines AL3 may not be in the same layer with any of the scan line and the data line.

Figure 3:
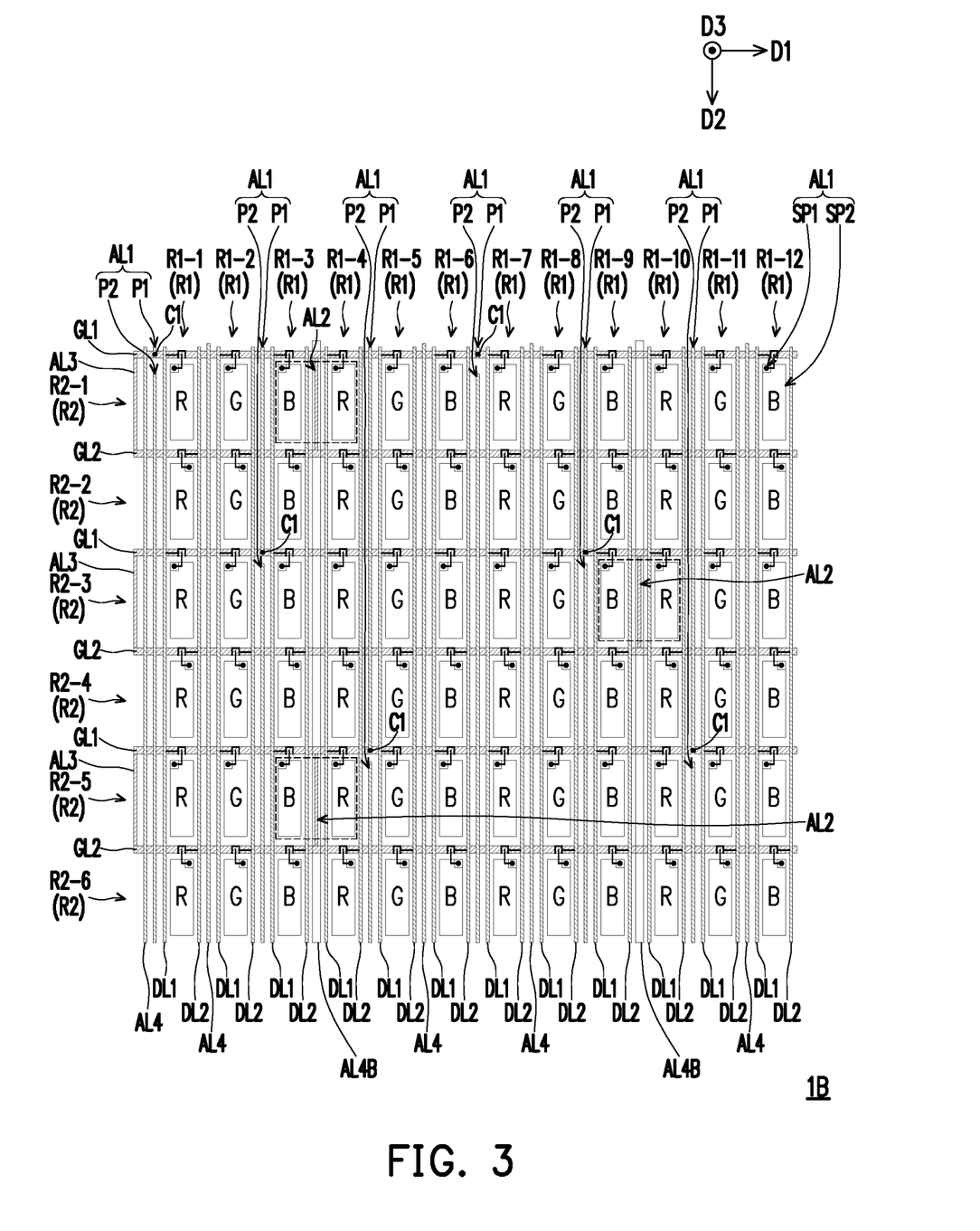

Referring to FIG. 3, a main difference between a display panel 1B and the display panel 1A of FIG. 2 is that at least one fourth auxiliary line AL4 (for example, a fourth auxiliary line AL4B) in the display panel 1B is overlapped with at least one second auxiliary line AL2 in the third direction D3 and is electrically insulated from the at least one second auxiliary line AL2. For example, the second auxiliary line AL2 may belong to the first conductive layer together with the first scan lines GL1 and the second scan lines GL2, and the fourth auxiliary line AL4B may belong to the second conductive layer together with the first data lines DL1 and the second data lines DL2, where the second auxiliary line AL2 and the fourth auxiliary line AL4B are electrically insulated from each other through at least one insulating layer. Alternatively, the second auxiliary line AL2 may belong to the second conductive layer together with the first data lines DL1 and the second data lines DL2, and the fourth auxiliary line AL4B may belong to a third conductive layer, where the second auxiliary line AL2 and the fourth auxiliary line AL4B are electrically insulated from each other through at least one insulating layer.

In some embodiments, the fourth auxiliary line AL4B is, for example, connected to the DC signal end to provide a voltage stabilizing effect, but the invention is not limited thereto. In some other embodiments, a potential of the fourth auxiliary line AL4B may be floating. By overlapping the fourth auxiliary line AL4B over the second auxiliary line AL2, a shielding effect may be provided, which helps to improve the display quality.

Figure 4:
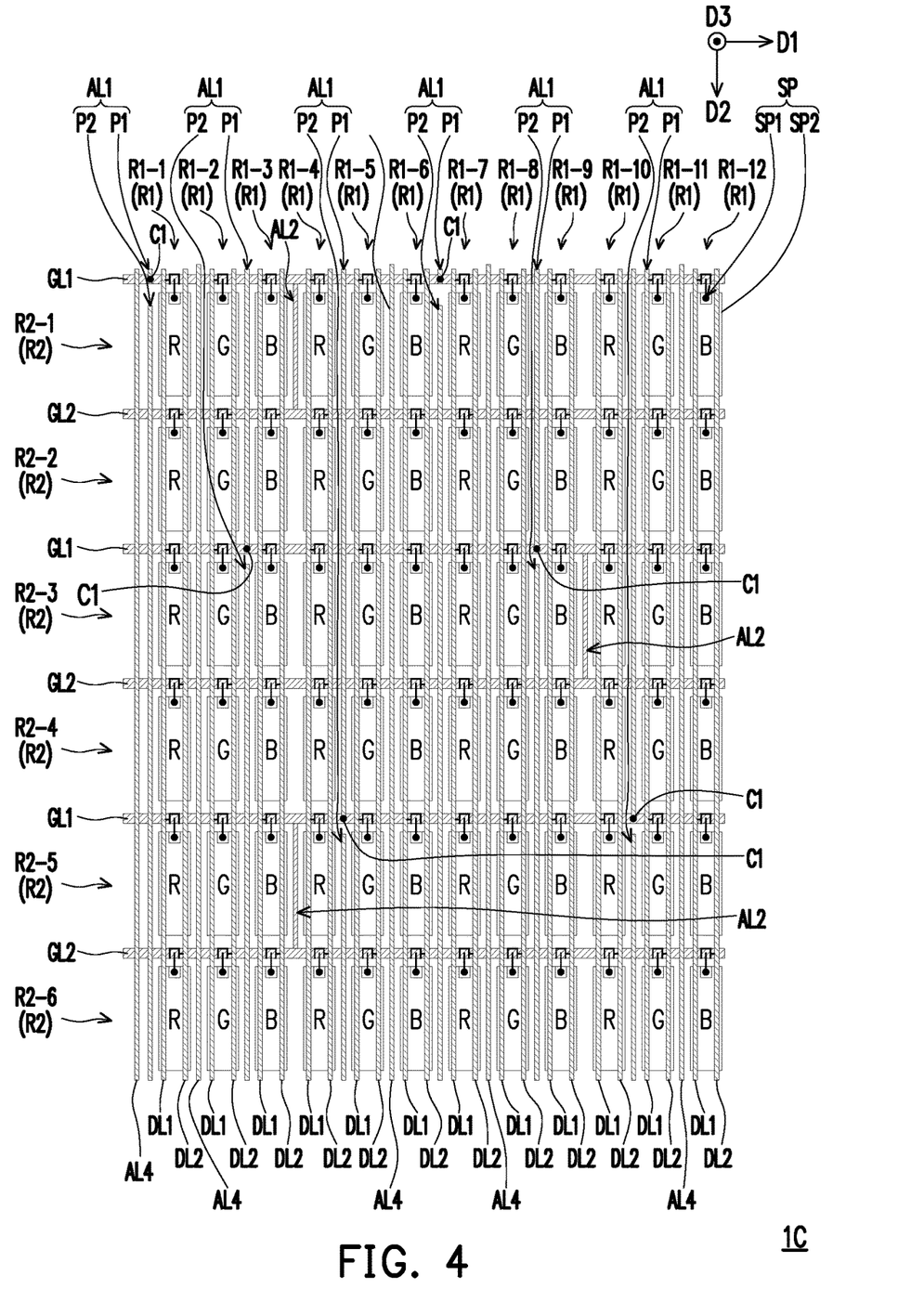

Referring to FIG. 4, a main difference between a display panel 1C and the display panel 1 of FIG. 1 is described below. In the display panel 1 of FIG. 1, the first data line DL1 and the second data line DL2 respectively disposed at opposite sides of a first row R1 is not overlapped with the sub-pixels SP in the first row R1. On the other hand, in the display panel 1C of FIG. 4, the first data line DL1 and the second data line DL2 respectively disposed at opposite sides of a first row R1 is overlapped with the sub-pixels SP in the first row R1. It should be noted that some changes and adjustments can be made to the overlapping manners (such as film stacking method, overlapping area or wiring method of each data line on sub-pixel SP, etc.), relative arrangement relations or connection relations of each sub-pixel SP and the first data line DL1 and the second data line DL2 overlapped with it by any person with ordinary skill in the art according to actual design requirements or referring to the existing circuit design, without departing from the spirit and scope of this disclosure, and they are all within the scope of protection of this disclosure. It is also mentioned that any embodiment of the present disclosure (such as the embodiments shown in FIG. 2 and FIG. 3) can be modified in the same way, and will not be repeated here.

In summary, in the embodiments of the invention, a plurality of the first auxiliary lines may be electrically connected to the corresponding first scan line, so that the scan signals and the data signals are input from a same side of the display panel. The second scan line may be electrically connected to the corresponding first scan line through the second auxiliary line, so that the first portion of the first auxiliary line electrically connected to the first scan line may be electrically connected to the second scan line without using the conductive via. By using of the second auxiliary line to achieve the synchronous reception of the scan signal between the first scan line and the second scan line, the influence range of the coupling effect is reduced, thereby improving the image performance.

In some embodiments, the first auxiliary lines may be formed together with the first data lines and the second data lines without adding additional manufacturing processes. In some embodiments, by increasing the number of the first auxiliary lines electrically connected to each of the first scan lines, the impedance is reduced and the uniformity of the display image is improved. In some embodiments, the second auxiliary lines may be arranged in a staggered manner to avoid the Moire pattern phenomenon caused by periodic structure and reduce the human eye's perception of gray scale variation. In some embodiments, the second auxiliary lines may be formed together with the first scan lines and the second scan lines (or the first data lines and the second data lines) without adding additional manufacturing processes. In some embodiments, by increasing the number of the second auxiliary lines that electrically connect each of the first scan lines with the corresponding second scan line, the impedance is reduced and the uniformity of the display image is improved. In some embodiments, the first scan line is located on one side of the two electrically connected adjacent second rows (for example, the side of the gate signal end) instead of between the two electrically connected adjacent second rows to reduce the number of the sub-pixels affected by the coupling effect of the first scan line (or the second scan line) and the first portion of the first auxiliary line (or the second auxiliary line) in the two adjacent second rows. In some embodiments, each of the second auxiliary lines may be disposed between the adjacent red sub-pixel and blue sub-pixel to avoid the coupling effect from affecting the green sub-pixel where the human eyes are more likely to perceive the gray scale variation. In some embodiments, the first portion of the first auxiliary line electrically connected to the first scan line may not be extended to the top of the electrically connected second scan line, thereby minimizing the number of the sub-pixels affected by the coupling effect of the first portion and the first scan line (or the second scan line). In some embodiments, the display panel may further include a plurality of third auxiliary lines to reduce the impedance and improve the uniformity of the display image, where each of the second scan lines may also be electrically connected to the corresponding first scan line through at least one third auxiliary line. In some embodiments, the display panel may further include a plurality of fourth auxiliary lines, and the fourth auxiliary lines may be used for voltage stabilization or as repair lines. In some embodiments, the fourth auxiliary lines may be formed together with the first data lines and the second data lines without adding additional manufacturing processes. In some embodiments, the fourth auxiliary lines may be overlapped over the second auxiliary lines to provide a shielding effect and improve display quality.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A display panel, comprising:
    a plurality of sub-pixels, arranged into a plurality of first rows arranged in a first direction and a plurality of second rows arranged in a second direction intersected with the first direction;
    a plurality of first scan lines and a plurality of second scan lines, arranged in alternation in the second direction and respectively electrically connected to the second rows;
    a plurality of first data lines and a plurality of second data lines, arranged in alternation in the first direction, wherein there are one first data line and one second data line between any two adjacent first rows, and the second rows are electrically connected to the first data lines and the second data lines in alternation;
    a plurality of first auxiliary lines and a plurality of first conductive vias, each of the first auxiliary lines extending in the second direction and comprising a first portion and a second portion arranged in the second direction, wherein the first portion is electrically connected to one corresponding first scan line through at least one first conductive via, and the second portion is spaced apart from the first portion and electrically insulated from the first portion; and
    a plurality of second auxiliary lines, respectively located between two adjacent first rows, wherein each of the second auxiliary lines extends from one corresponding first scan line to the adjacent second scan line in the second direction, and each of the second scan lines is electrically connected to one corresponding first scan line through at least one second auxiliary line.

2. The display panel as claimed in claim 1, wherein each of the first scan lines is electrically connected to one second scan line and two adjacent second rows, and the electrically connected one first scan line and the one second scan line are respectively located at opposite sides of one of the two adjacent second rows, and the one second scan line is located between the two adjacent second rows.

3. The display panel as claimed in claim 1, wherein the first auxiliary lines, the first data lines, and the second data lines belong to a same conductive layer.

4. The display panel as claimed in claim 1, wherein an end of the first portion close to the second portion terminates above one corresponding first scan line, and the second portion extends away from the first portion in the second direction from a position close to the end of the first portion.

5. The display panel as claimed in claim 1, wherein each of the first scan lines and one second scan line electrically connected thereto are electrically connected to the first portion of at least one first auxiliary line, and the first portion of the at least one first auxiliary line is not overlapped with the electrically connected second scan line in a third direction perpendicular to the first direction and the second direction.

6. The display panel as claimed in claim 1, wherein the first portion is connected to a gate signal end, and the second portion is connected to a direct current signal end.

7. The display panel as claimed in claim 1, wherein the second auxiliary lines, the first scan lines, and the second scan lines belong to a same conductive layer, and each of the second auxiliary lines is in contact with one electrically connected first scan line and one electrically connected second scan line.

8. The display panel as claimed in claim 1, wherein the second auxiliary lines do not belong to a same conductive layer as the first scan lines and the second scan lines, and the display panel further comprises:
   a plurality of second conductive vias, wherein each of the second auxiliary lines is electrically connected to one corresponding first scan line and one corresponding second scan line through plural of the second conductive vias.

9. The display panel as claimed in claim 1, wherein there is one or plural of the first rows between each of the second auxiliary lines and one electrically connected first auxiliary line.

10. The display panel as claimed in claim 1, wherein the second auxiliary lines are arranged in a staggered manner.

11. The display panel as claimed in claim 1, wherein each of the second scan lines is electrically connected to the one corresponding first scan line through plural of second auxiliary lines.

12. The display panel as claimed in claim 1, wherein the sub-pixels comprise a plurality of red sub-pixels, a plurality of green sub-pixels, and a plurality of blue sub-pixels, and each of the second auxiliary lines is located between the adjacent red and blue sub-pixels.

13. The display panel as claimed in claim 1, further comprising:
   a plurality of third auxiliary lines, disposed near ends of the first scan lines and the second scan lines, wherein each of the third auxiliary lines extends from one corresponding first scan line to the adjacent second scan line along the second direction, and each of the second scan lines is further electrically connected to the one corresponding first scan line through at least one third auxiliary line.

14. The display panel as claimed in claim 13, wherein the third auxiliary lines, the first scan lines, and the second scan lines belong to a same conductive layer, and each of the third auxiliary lines is in contact with one electrically connected first scan line and one electrically connected second scan line.

15. The display panel as claimed in claim 13, wherein the third auxiliary lines do not belong to a same conductive layer as the first scan lines and the second scan lines, and the display panel further comprises:
   a plurality of third conductive vias, wherein each of the third auxiliary lines is electrically connected to one corresponding first scan line and one corresponding second scan line through plural of the third conductive vias.

16. The display panel as claimed in claim 1, further comprising:
   a plurality of fourth auxiliary lines, respectively disposed between two adjacent first rows.

17. The display panel as claimed in claim 16, wherein the fourth auxiliary lines, the first data lines, and the second data lines belong to a same conductive layer.

18. The display panel as claimed in claim 16, wherein at least one fourth auxiliary line is overlapped with at least one second auxiliary line in a third direction perpendicular to the first direction and the second direction and is electrically insulated from the at least one second auxiliary line.

19. The display panel as claimed in claim 16, wherein there is one or plural of the first rows between each of the fourth auxiliary lines and the adjacent first auxiliary line.

20. The display panel as claimed in claim 1, wherein one first data line and one second data line respectively disposed at opposite sides of one of the first rows are overlapped with plural sub-pixels of the one of the first rows in a third direction.

* * * * *